(12) United States Patent
Liebmann et al.

(10) Patent No.: US 12,014,984 B2
(45) Date of Patent: Jun. 18, 2024

(54) METHOD OF MANUFACTURING A SEMICONDUCTOR APPARATUS HAVING STACKED DEVICES

(71) Applicant: Tokyo Electron Limited, Tokyo (JP)

(72) Inventors: Lars Liebmann, Mechanicville, NY (US); Jeffrey Smith, Clifton Park, NY (US); Anton deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/954,953

(22) Filed: Sep. 28, 2022

(65) Prior Publication Data
US 2023/0024975 A1 Jan. 26, 2023

Related U.S. Application Data

(62) Division of application No. 16/660,448, filed on Oct. 22, 2019, now Pat. No. 11,495,540.

(51) Int. Cl.
*H01L 23/528* (2006.01)
*H01L 21/768* (2006.01)
(Continued)

(52) U.S. Cl.
CPC .... *H01L 23/5286* (2013.01); *H01L 21/76895* (2013.01); *H01L 23/5283* (2013.01); *H01L 25/071* (2013.01); *H01L 27/092* (2013.01)

(58) Field of Classification Search
CPC ........... H01L 23/5286; H01L 21/76895; H01L 23/5283; H01L 25/071; H01L 27/092;
(Continued)

(56) References Cited

U.S. PATENT DOCUMENTS 8,501,609 B2 8/2013 Roizin et al.
8,765,598 B2 7/2014 Smith et al.
(Continued)

FOREIGN PATENT DOCUMENTS

KR 10-2018-0033877 A 4/2018
KR 10-2018-0077045 A 7/2018

OTHER PUBLICATIONS

International Search Report and Written Opinion issued Dec. 2, 2020 in PCT/US2020/047413, 9 pages.

*Primary Examiner* — Bitew A Dinke

(57) ABSTRACT

A method for forming a semiconductor apparatus includes forming a plurality of repetitive initial structures over a substrate of the semiconductor apparatus. An initial structure in the plurality of repetitive initial structures is formed by forming a first stack of transistors along a Z direction substantially perpendicular to a substrate plane, and forming local interconnect structures. Each of the transistors in the first stack of transistors is sandwiched between two of the local interconnect structures. Vertical conductive structures are formed substantially parallel to the Z direction, a height of one of the vertical conductive structures along the Z direction being at least a height of the initial structure. The initial structure is functionalized into a final structure by forming one or more connections each electrically coupling one of the local interconnect structures to one of the vertical conductive structures.

18 Claims, 10 Drawing Sheets

(51) Int. Cl.
*H01L 25/07* (2006.01)
*H01L 27/092* (2006.01)

(58) Field of Classification Search
CPC ............ H01L 25/0652; H01L 21/8221; H01L 21/823871; H01L 21/823475; H01L 27/088; H01L 23/5226; H01L 25/50; H01L 27/0688
See application file for complete search history.

(56) References Cited

U.S. PATENT DOCUMENTS

| | | | |
|---|---|---|---|
| 9,035,686 B1 | 5/2015 | Hsu et al. | |
| 9,270,255 B2 | 2/2016 | Kwon et al. | |
| 9,397,641 B2 | 7/2016 | Hsu et al. | |
| 9,646,994 B2 | 5/2017 | Liu et al. | |
| 9,653,289 B1* | 5/2017 | Balakrishnan | H01L 29/4983 |
| 9,960,753 B2 | 5/2018 | Hsu et al. | |
| 10,008,583 B1 | 6/2018 | Rodder et al. | |
| 10,177,227 B1 | 1/2019 | Yoshida et al. | |
| 10,224,341 B2 | 3/2019 | Kim et al. | |
| 10,270,430 B2 | 4/2019 | Guo et al. | |
| 10,381,559 B1 | 8/2019 | Zhou et al. | |
| 10,483,284 B2 | 11/2019 | Kim et al. | |
| 10,553,574 B2 | 2/2020 | Seo et al. | |
| 10,686,428 B2 | 6/2020 | Guo et al. | |
| 11,114,381 B2 | 9/2021 | Liebmann et al. | |
| 2010/0226195 A1* | 9/2010 | Lue | H10B 43/20 257/E21.602 |
| 2010/0252800 A1* | 10/2010 | Chidambarrao | H01L 29/0665 977/762 |
| 2011/0084314 A1* | 4/2011 | Or-Bach | H01L 29/808 257/209 |
| 2011/0227141 A1 | 9/2011 | Jeong et al. | |
| 2011/0260773 A1 | 10/2011 | Granger-Jones et al. | |
| 2012/0007654 A1 | 1/2012 | Lam et al. | |
| 2013/0002149 A1 | 1/2013 | Mott et al. | |
| 2013/0070506 A1 | 3/2013 | Kajigaya | |
| 2015/0069499 A1 | 3/2015 | Nakaki | |
| 2015/0116019 A1 | 4/2015 | Hsu et al. | |
| 2015/0123215 A1* | 5/2015 | Obradovic | H01L 29/78681 257/410 |
| 2015/0206900 A1 | 7/2015 | Nam et al. | |
| 2015/0249442 A1 | 9/2015 | Hsu et al. | |
| 2015/0270340 A1 | 9/2015 | Frank et al. | |
| 2016/0172358 A1* | 6/2016 | Hatcher | H01L 29/775 257/401 |
| 2016/0190247 A1* | 6/2016 | Frank | H01L 21/31105 438/151 |
| 2016/0307928 A1* | 10/2016 | Liu | H01L 27/0924 |
| 2016/0322962 A1 | 11/2016 | Hsu et al. | |
| 2017/0053906 A1* | 2/2017 | Or-Bach | H10B 12/20 |
| 2017/0117291 A1 | 4/2017 | Or-Bach et al. | |
| 2017/0294430 A1 | 10/2017 | Seo et al. | |
| 2018/0047832 A1* | 2/2018 | Tapily | H01L 29/785 |
| 2018/0138200 A1 | 5/2018 | Kim et al. | |
| 2018/0145678 A1 | 5/2018 | Maxim et al. | |
| 2018/0183414 A1 | 6/2018 | Guo et al. | |
| 2018/0254345 A1* | 9/2018 | Chang | B82Y 40/00 |
| 2018/0315838 A1 | 11/2018 | Morrow et al. | |
| 2018/0337256 A1* | 11/2018 | Anderson | H01L 29/41741 |
| 2019/0019693 A1* | 1/2019 | Or-Bach | H01L 25/50 |
| 2019/0044063 A1 | 2/2019 | Fratin et al. | |
| 2019/0067459 A1* | 2/2019 | Balakrishnan | H01L 29/0676 |
| 2019/0103407 A1 | 4/2019 | Kim et al. | |
| 2019/0109196 A1* | 4/2019 | Sonehara | H10B 43/35 |
| 2019/0172826 A1* | 6/2019 | Or-Bach | H01L 27/0688 |
| 2019/0173456 A1 | 6/2019 | Guo et al. | |
| 2019/0198616 A1* | 6/2019 | Coquand | H01L 29/41725 |
| 2019/0244933 A1 | 8/2019 | Or-Bach et al. | |
| 2019/0326288 A1* | 10/2019 | Hashemi | H01L 21/823821 |
| 2019/0355723 A1* | 11/2019 | Miao | H01L 29/78684 |
| 2020/0035691 A1* | 1/2020 | Reznicek | H01L 29/105 |
| 2020/0075489 A1* | 3/2020 | Liebmann | H01L 21/823828 |
| 2020/0075574 A1 | 3/2020 | Smith et al. | |
| 2020/0075592 A1* | 3/2020 | Liebmann | H01L 21/76895 |
| 2020/0126968 A1 | 4/2020 | Seo et al. | |
| 2020/0303388 A1* | 9/2020 | Reznicek | H01L 21/823857 |
| 2020/0313659 A1 | 10/2020 | Guo et al. | |
| 2020/0373330 A1* | 11/2020 | Liebmann | H10B 99/00 |
| 2021/0057419 A1 | 2/2021 | Shin et al. | |

\* cited by examiner

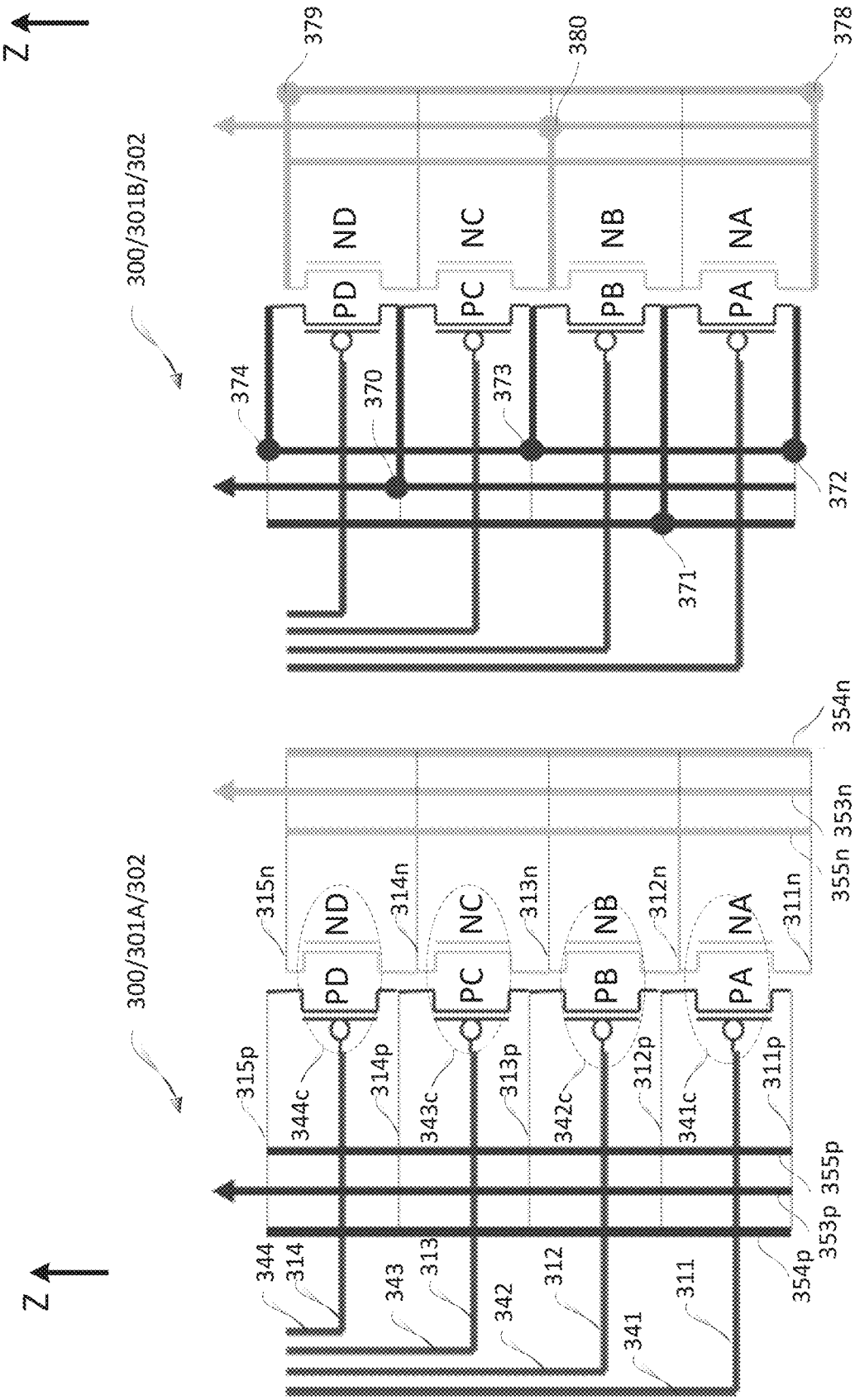

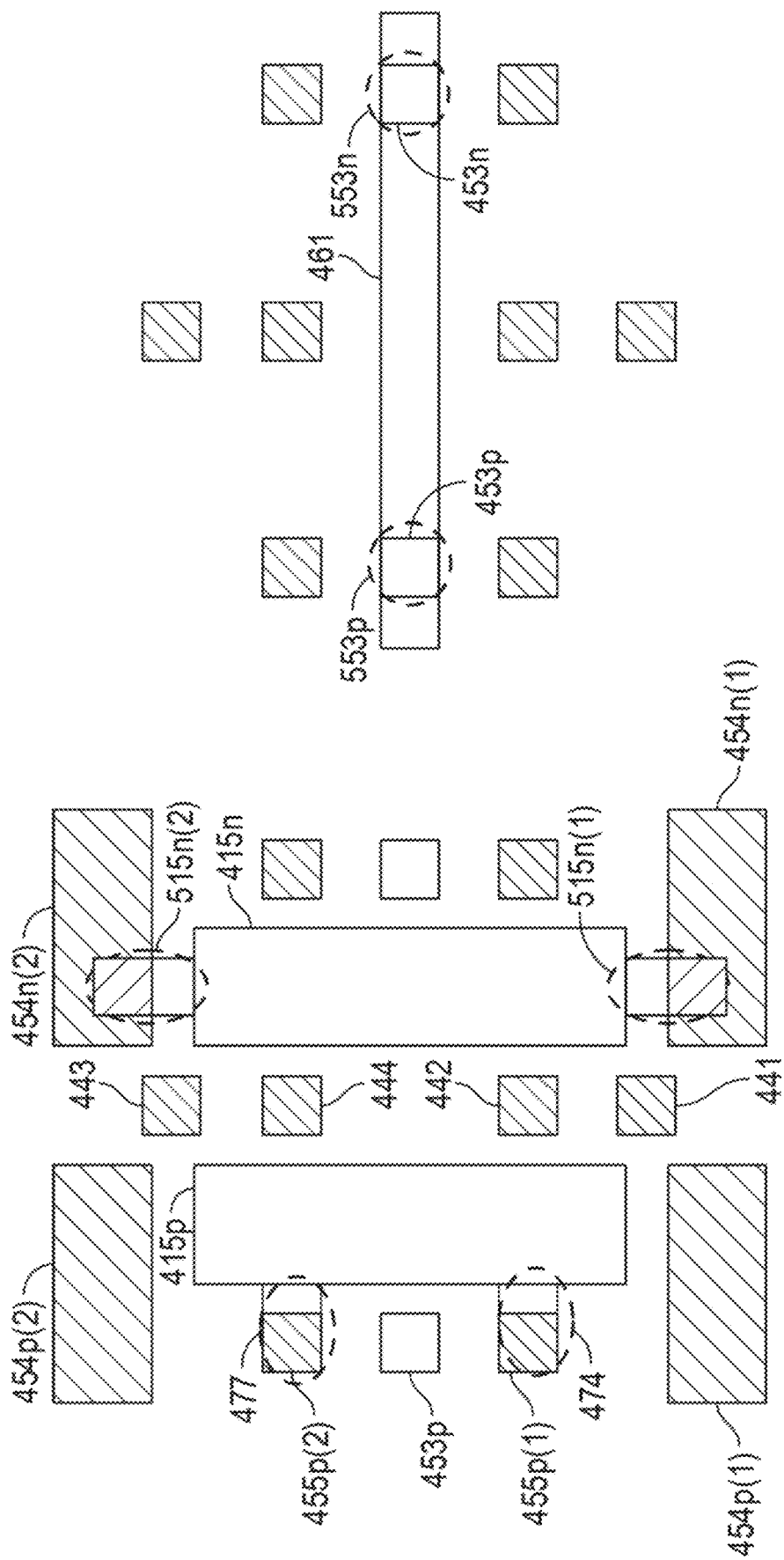

METHOD OF MANUFACTURING A SEMICONDUCTOR APPARATUS HAVING STACKED DEVICES

CROSS-REFERENCE TO RELATED APPLICATION

This application is a divisional of U.S. application Ser. No. 16/660,448 filed Oct. 22, 2019, the entire contents of which are incorporated herein by reference.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Semiconductor devices are widely used in various electronic apparatuses, such as smart phones, computers, and the like. In general, a typical semiconductor device includes a substrate having active devices such as transistors, capacitors, inductors and other components. There is an ever increasing demand for smaller and faster semiconductor devices which are simultaneously able to support a greater number of increasingly complex and sophisticated functions. This scaling down process generally provides benefits by increasing production efficiency and lowering associated costs. Nevertheless, such scaling down has also increased the complexity of processing and manufacturing of the semiconductor devices. As dimensions of semiconductor devices scale to smaller sub-micron sizes in advanced technology nodes, it becomes more challenging to increase the density of semiconductor devices. Improved structures and methods for manufacturing same are desired.

SUMMARY

Aspects of the disclosure provide a semiconductor apparatus including a plurality of structures. A first one of the structures comprises a first stack of transistors that includes a first transistor formed on a substrate and a second transistor stacked on the first transistor along a Z direction substantially perpendicular to a substrate plane of the semiconductor apparatus. The first one of the structures further includes local interconnect structures. The first transistor is sandwiched between two of the local interconnect structures. The first one of the structures further includes vertical conductive structures substantially parallel to the Z direction. The vertical conductive structures are configured to provide at least power supplies for the first one of the structures by electrically coupling with the local interconnect structures. A height of one of the vertical conductive structures along the Z direction is at least a height of the first one of the structures. In some examples, a second one of the structures has identical components as the first one of the structures.

The local interconnect structures can have a smaller dimension along the Z direction than dimensions within the substrate plane and are substantially parallel to the substrate plane. The vertical conductive structures can be formed over the substrate in a different area than the first stack. The vertical conductive structures can comprise power-rails for a first supply voltage and a second supply voltage where the heights of the power-rails are equal to or larger than the height of the first one of the structures. The first supply voltage is more positive than the second supply voltage.

The vertical conductive structures can comprise a vertical connection for outputting an output signal where the height of the vertical connection is larger than the height of the first one of the structures.

In an example, the local interconnect structures include a lower local interconnect structure below the first transistor and an upper local interconnect structure above the second transistor. The vertical conductive structures include a vertical connection that electrically couples the first transistor and the second transistor via the lower and upper local interconnect structures, respectively, where the height of the vertical connection is equal to or larger than the height of the first one of the structures.

In an example, the first one of the structures further comprises a second stack of transistors adjacent to the first stack. The second stack includes a third transistor formed on the substrate and a fourth transistor stacked on the third transistor along the Z direction. The second stack is in a different area than the first stack and the vertical connection structures. The first one of the structures further includes a first gate connection structure electrically coupling a first gate of the first transistor with a third gate of the third transistor and a second gate connection structure electrically coupling a second gate of the second transistor with a fourth gate of the fourth transistor.

The first gate and the second gate can be p-type gates and the third gate and the fourth gate can be n-type gates.

The vertical conductive structures can comprise vertical connections electrically coupling the first and second gate connection structures to respective input signals at a wiring level that is above the first one of the structures.

In an example, the first transistor and the second transistor are vertical field-effect transistors (VFETs) where a current between a source and a drain of each of the first and the second transistors flows substantially along the Z direction.

In an example, the first one and the second one of the structures are logic cells that implement a same random logic function.

In an example, the first one of the structures is a logic cell that implements a first random logic function and a second one of the structures is a logic cell that implements a second random logic function that is different from the first random logic function.

The vertical connection structures can surround the first stack of transistors and the second stack of transistors.

The power-rails can be electrically coupled to the first stack of transistors via one or more of the local interconnect structures.

The vertical connection can be electrically coupled to the first stack of transistors via one or more of the local interconnect structures.

The vertical connection can be electrically coupled to the first stack of transistors via one or more of the local interconnect structures.

Aspects of the disclosure provide a method for forming a semiconductor apparatus. The method includes forming a plurality of repetitive initial structures over a substrate of the semiconductor apparatus. An initial structure in the plurality of repetitive initial structures is formed by forming a first stack of transistors along a Z direction substantially perpendicular to a substrate plane and forming local interconnect structures where each of the first stack of transistors is sandwiched between two of the local interconnect structures. The initial structure is further formed by forming vertical conductive structures substantially parallel to the Z direction where a height of one of the vertical conductive structures along the Z direction is at least a height of the initial structure. The method further includes functionalizing the initial structure into a final structure by forming one or more connections based on the local interconnect structures and the vertical conductive structures.

In an example, forming the vertical conductive structures includes forming the vertical conductive structures over the substrate in a different area than the first stack of transistors.

In an example, forming the vertical conductive structures includes forming power-rails for a first supply voltage and a second supply voltage where heights of the power-rails is equal to or larger than the of the initial structure.

BRIEF DESCRIPTION OF THE DRAWINGS

Various embodiments of this disclosure that are proposed as examples will be described in detail with reference to the following figures, wherein like numerals reference like elements, and wherein:

FIG. 3A shows a schematic of a semiconductor apparatus 302 including a 3D layout primitive 300 that is not functionalized according to an embodiment of the disclosure;

FIG. 3B shows a schematic of the semiconductor apparatus 302 including the functionalized 3D layout primitive 300 according to an embodiment of the disclosure;

FIGS. 4A-4C and 5A-5F show an exemplary implementation of the semiconductor apparatus 302 and the 3D layout primitive 300 in 3D perspective views and 2D cross-sectional views, respectively according to some embodiments of the disclosure.

DETAILED DESCRIPTION OF EMBODIMENTS

Figure 1:
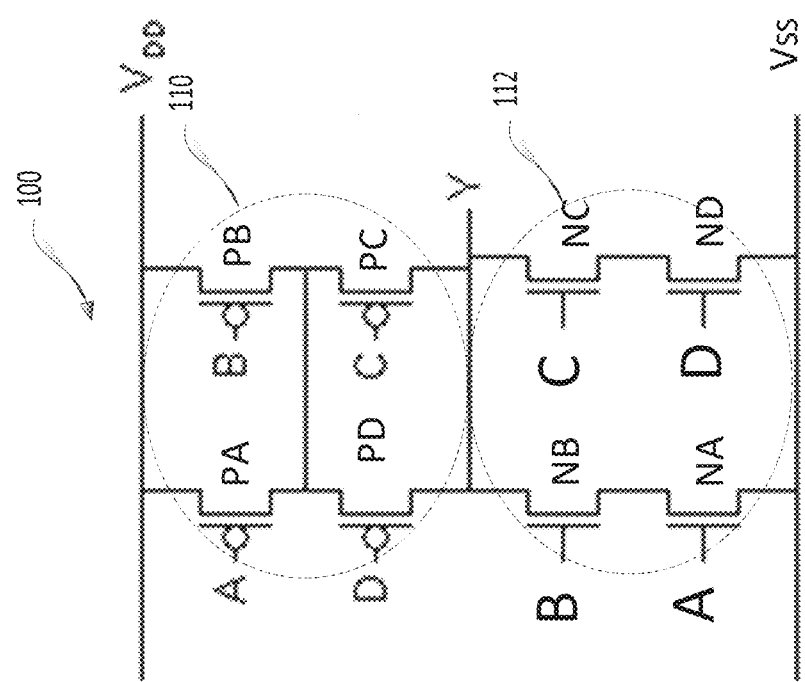
FIG. 1 shows an exemplary circuit schematic 100 for an AOI22 cell according to an embodiment of the disclosure.

A semiconductor apparatus can include one or more types of cells, such as memory cells, standard cells including Inverters, AOI (AND-OR-Invert) cells, and/or the like that can implement one or more types of logic functions. Semiconductor devices, such as transistors, can be stacked along a Z direction that is substantially perpendicular to a substrate plane, for example, a planar working surface of a substrate of the semiconductor apparatus to increase a device density, i.e., a number of semiconductor devices per unit area of the substrate plane. Thus, the semiconductor apparatus can be referred to as a three-dimensional (3D) semiconductor apparatus. According to aspects of the disclosure, the 3D semiconductor apparatus can be manufactured by forming a 3D layout primitive including a plurality of highly repetitive initial structures that are similar or identical. Each of the initial structures can include a stack of semiconductor devices along the Z direction, local interconnect structures that can be substantially parallel to the substrate plane, and vertical conductive structures that can be substantially parallel to the Z direction. The semiconductor devices in the stack can be sandwiched between the local interconnect structures. In an example, each of the semiconductor devices is sandwiched between two of the local interconnect structures. The vertical conductive structures can be disposed in a different area over the substrate than that of the stack. One of heights of the vertical conductive structures along the Z direction is at least a height of the stack along the Z direction.

Subsequently, the initial structures can be functionalized or customized into final structures (i.e., the one or more types of cells) by adding or subtracting connective structures (also referred to connections or jumpers) at certain locations. Thus, one of the final structures can further include connections between the vertical conductive structures and the local interconnect structures. Accordingly, the local interconnect structures can feed current(s) into or draw current(s) out of the semiconductor devices in the one of the final structures or pass a current internally, i.e., among the semiconductor devices within the one of the final structures. The vertical conductive structures can provide power supplies and input signal(s) to the semiconductor devices and interconnections that electrically couple the semiconductor devices. The semiconductor devices can provide output signal(s) using one or more of the vertical conductive structures.

In general, the 3D layout primitive can be customized for various circuits including various cells. The semiconductor devices can be transistors, such as field effect transistors (FETs). In an example, the semiconductor devices are vertical FETs (VFETs) where a current between a source and a drain of each VFET flows substantially along the Z direction.

In an example, the 3D semiconductor apparatus includes a first type of cells (e.g., an Inverter) and a second type of cells (e.g., an AOI cell) where the second type of cells is different from the first type of cells. The 3D layout primitive includes the identical initial structures. Subsequently, a first subset of the initial structures is functionalized into first final structures, i.e., the first type of cells, and a second subset of the initial structures is functionalized into second final structures, i.e., the second type of cells, by adding and/or subtracting connections at certain locations in the first and second subsets of initial structures, respectively. Therefore, the initial structures in the non-functionalized 3D layout primitive of the 3D semiconductor apparatus are identical, and the final structures in the functionalized 3D layout primitive including the first final structures and the second final structures are different.

As described above, the non-functionalized 3D layout primitive can have a high degree of layout regularity, for example, different types of cells implementing different types of logic functions can have similar or identical initial structures. In an example, similar or identical connectivity options (or connection options), e.g., the local interconnect structures, the vertical conductive structures, or certain connections described above, for the semiconductor devices are provided in the initial structures. In order to distinguish the different types of cells, the semiconductor devices in one type of cells are wired or connected differently from those in another type of cells via customization or functionalization of the respective initial structures. Therefore, degrees of freedom in design and manufacturing the 3D semiconductor apparatus can be reduced using the 3D layout primitive, and thus the design process can be streamlined while maintaining the design efficiency. Further, using the 3D layout primitive can facilitate process optimization and mask level reduction while providing the connectivity options to build a logic library including various standard cells. The cell-specific functionalization can be obtained without significantly increasing process or design complexity.

The disclosure is related to a 3D semiconductor apparatus, such as described above and a method to manufacture the 3D semiconductor apparatus, for example, to improve the design and manufacturing efficiency of the 3D semiconductor apparatus. According to an aspect of the disclosure, a 3D layout primitive including highly repetitive initial structures can be manufactured and subsequently the initial structures can be functionalized by adding or subtracting connections at certain locations to form the final structures in the 3D semiconductor apparatus.

A circuit, such as an integrated circuit (IC) can be implemented using a 3D semiconductor apparatus, a planar (or two-dimensional (2D)) semiconductor apparatus, or the like. The 3D semiconductor apparatus can have a higher device density than that of the 2D semiconductor apparatus. Accordingly, 3D integration where multiple devices are vertically stacked over a substrate plane of a semiconductor apparatus can overcome scaling limitations experienced in planar devices by increasing a device density in volume rather than in area. The device density can also be referred to as a transistor density when the multiple devices are transistors. For example, a transistor density is increased by implementing 3D NOT-AND (NAND) in the flash memory industry.

Implementing 3D random logic designs can be challenging. In various examples, logic designs are composed from a predefined set of standard cells (or logic standard cells). Each standard cell can provide a physical implementation of a logic function, such as a combinatorial or a sequential logic function. A logic function can be Invert, NAND, NOR (Not OR), AND, AOI, or the like. Accordingly, a standard cell can be an Inverter, a NAND cell, a NOR cell, an AND cell, an AOI cell, or the like.

A technology node (also a process node or a process technology) can refer to a specific semiconductor manufacturing process and design rules for the specific semiconductor manufacturing process. Different technology nodes can imply different circuit generations and architectures. Wiring levels in a semiconductor apparatus can be numbered from a lowest wiring level that is closest to a substrate of the semiconductor apparatus to a highest wiring level that is furthest away from the substrate. In an example, wiring levels can be referred to as M0 (for metal 0), M1 (for first metal or metal 1), M2 (for second metal or metal 2), and the like.

In a planar semiconductor apparatus including standard cells, especially in advanced technology nodes that are subject to a high degree of layout regularity, cell-specific customization or functionalization can be achieved in lowest wiring levels, such as the two (e.g., M0-M1) to three lowest wiring levels (e.g., M0-M2). Different logic functions in the semiconductor apparatus can be distinguished by how transistors in the semiconductor apparatus are wired together.

In the disclosure, an AOI22 logic function is used as an example, and thus, an AOI22 cell is used as an example of a standard cell. The description can be suitably adapted when a semiconductor apparatus includes other types of cells. The other types of cells can be logic cells implementing different logic functions, memory cells, and/or the like. FIG. 1 shows an exemplary circuit schematic 100 for an AOI22 cell (also referred to as an AOI cell) according to an embodiment of the disclosure. The AOI cell is a moderately complex cell and is widely used in a common logic design. Referring to FIG. 1, a first part 110 can include four p-type transistors PA-PD where PA and PB are connected in parallel and PC and PD are connected in parallel. A second part 112 can include four n-type transistors NA-ND where NA and NB are connected in series and NC and ND are connected in series. The circuit 100 is electrically coupled to four input signals A-D and an output signal Y. Each of the four input signals A-D is coupled to a respective n-type gate and p-type gate of the circuit 100. For example, the input signal A is coupled to an n-type gate of NA and a p-type gate of PA. A first supply voltage VDD is coupled to source regions (or sources) of the p-type transistors PA-PB, respectively. A second supply voltage VSS is coupled to source regions of the n-type transistors NA and ND. In an example, the first supply voltage VDD is a more positive supply voltage than the second supply voltage VSS. In various examples, the second supply voltage VSS is a ground voltage (GND) that is connected to ground.

Figure 2A:
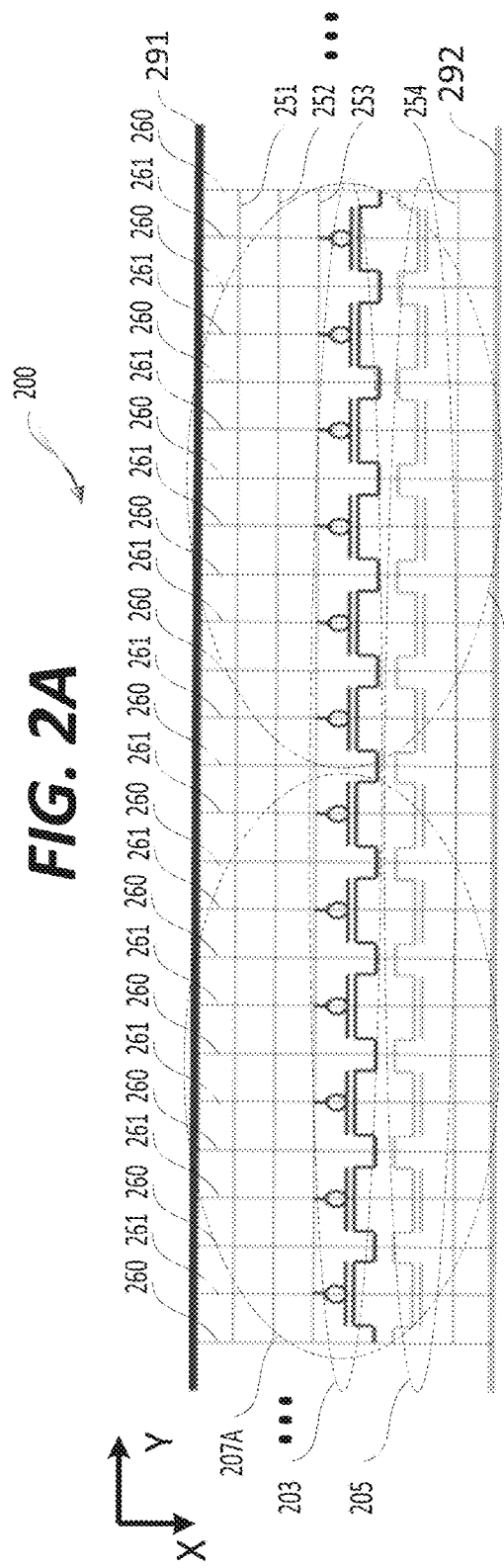
FIGS. 2A-2B show an exemplary 2D layout primitive 200 according to an embodiment of the disclosure.
Figure 2B:
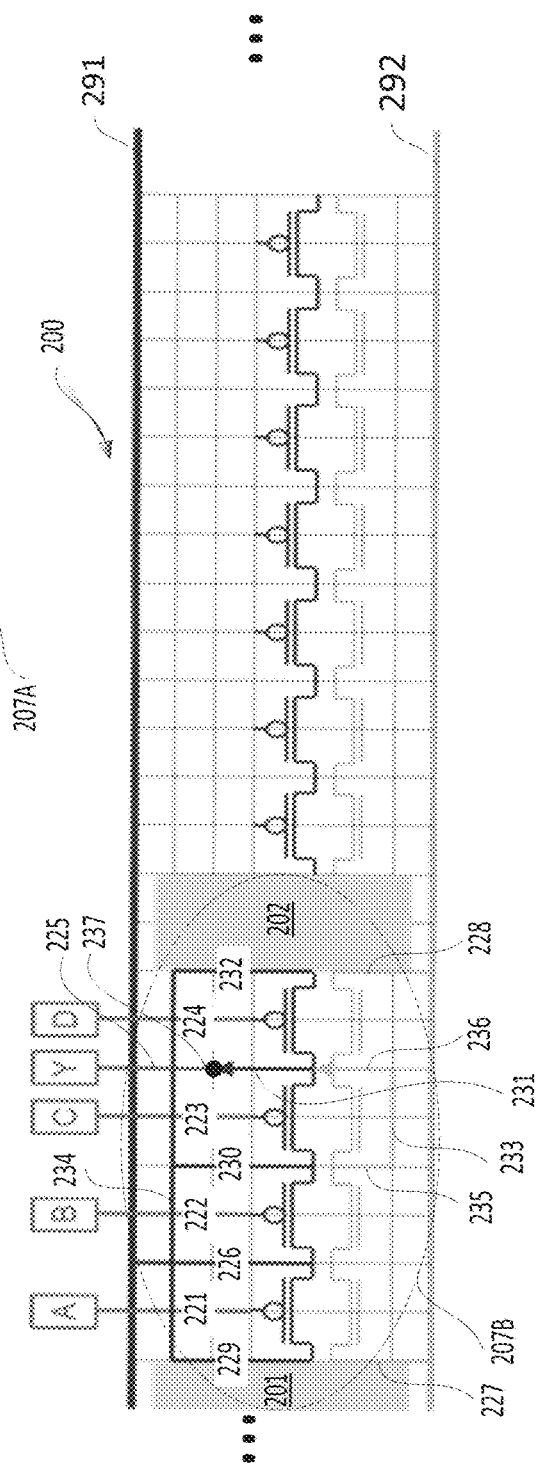

FIGS. 2A-2B show an exemplary 2D layout primitive 200 according to an embodiment of the disclosure. In general, a layout primitive can be customizable for various circuits. Referring to FIG. 2A, the 2D layout primitive 200 includes a row of complementary FETs (CFETs), power-rails including a first power-rail 291 configured to be connected to the first supply voltage VDD and a second power-rail 292 configured to be connected to the second supply voltage VSS, first tracks (also referred to as signal wiring channels, horizontal wiring channels, or wiring channels) 251-254, second tracks (also referred to as vertical wiring channels or wiring channels) 260-261, and/or the like. In the example shown in FIGS. 2A-2B, the first tracks 251-254 and the second tracks 260-261 are empty tracks available for future structures (e.g., connections 221-236 in FIG. 2B) to be placed into. The first and second power-rails 291-292 can be continuous and made of conductive material(s). In an example, the first and second power-rails 291-292 and the first tracks 251-254 are substantially parallel to a Y direction. Referring to FIG. 2A, the first tracks 251-254 are positioned between the first and second power-rails 291-292. The first tracks 251-254 can be substantially perpendicular to the second tracks 260-261 that are along an X direction. The X and Y directions are perpendicular and are within a substrate plane of the 2D layout primitive 200.

The row of CFETs includes a first row 203 of p-type transistors that are coupled together in series and a second row 205 of n-type transistors that are coupled together in series. Referring to FIG. 2A, the 2D layout primitive 200 can be implemented using a 6-track planar CFET technology that includes 6 metal tracks where 4 of the 6 metal tracks correspond to the first structures 251-254.

Referring to FIG. 2A, the 2D layout primitive 200 includes a plurality of high repetitive initial structures 207A. FIG. 2B shows an example where the initial structure 207A in FIG. 2A is functionalized into a final structure 207B. Referring to FIG. 2B, the final structure 207B is an AOI22 cell that implements the circuit 100 in FIG. 1. The final structure 207B or the AOI22 cell can be formed by selectively adding diffusion breaks 201-202 and forming the connections 221-236. The diffusion breaks 201-202 can isolate the final structure 207B from adjacent cells or structures. Comparing the initial structure 207A and the final structure 207B, a portion of the first track 251 is functionalized into the connection 234 and a portion of the first track 254 is functionalized into the connection 233. Portions of the second tracks 261 are functionalized into the connections 221-224, respectively. Portions of the second track 260 are functionalized into the connections 225, 231, 235, and 236, respectively.

The connections 221-224 can electrically couple the p-gates and n-gates to the input signals A-D, respectively, and thus can be referred to as the signal input connections. The connection 231 can electrically couple drains of the p-type transistors PC-PD to a contact 237. The contact 237 is electrically coupled to the output signal Y via the connection 225 (or the signal output connection). In an example (not shown), the connections 225 and 231 can be combined into a single connection. The connection 233, 235, and 236 can electrically couple drains of the n-type transistors NB-NC to the drains of the p-type transistors PC-PD, and thus to the output signal Y. The connections 229, 230, 232, and 234 can electrically couple respective terminals of the p-type transistors PA-PD internally (i.e., within the final structure 207B). The connections 229-236 can be referred to as the internal signal connections. The connection 226 can electrically couple terminals of the p-type transistors PA-PB to the first power-rail 291. The connections 227-228 can electrically couple terminals of the n-type transistors NA and ND to the second power-rail 292. The connections 226-228 can be referred to as internal power connections or power taps. The connections 221-225 can connect the respective terminals of PA-PD and NA-ND to, for example, one or more wiring levels that are above PA-PD and NA-ND. The above description can be suitably adapted to functionalize other initial structures 207A in FIG. 2A into other final structures in FIG. 2B. The other final structures can be identical to or different from the final structure 207B. For example, one of the other final structures can implement a NOR logic. For purposes of brevity, the detailed descriptions are omitted.

According to an aspect of the disclosure, a 3D layout primitive can be used in designing and manufacturing a 3D semiconductor apparatus. The 3D semiconductor apparatus can include any suitable circuits, such as random logic circuits, memory circuits, and/or the like. In the descriptions below, a AOI22 cell implementing the circuit 100 is used as an example to illustrate a 3D layout primitive. The description can be suitably adapted to a semiconductor apparatus including various circuits and/or standard cells.

FIG. 3A shows a schematic of a semiconductor apparatus 302 including a 3D layout primitive 300 that is not functionalized. The 3D layout primitive 300 can include a plurality of highly repetitive initial structures. For purposes of brevity, one of the initial structures 301A is shown in FIG. 3A. The initial structure 301A includes a first stack having p-type transistors PA-PD stacked vertically (i.e., along a Z direction perpendicular to a substrate plane of the 3D semiconductor apparatus 302) and in series. The initial structure 301A includes a second stack having n-type transistors NA-ND stacked vertically and in series. The first stack can be referred to as stacked VFETs, and the second stack can be referred to as stacked VFETs. The first stack and the second stack can form a stack of CFETs 341c-344c. For example, PA and NA form the CFET 341c, PB and NB form the CFET 342c, PC and NC form the CFET 343c, and PD and ND form the CFET 344c. Comparing FIGS. 2A and 3A, the 3D layout primitive 300 can have a higher device density than that of the 2D layout primitive 200.

The initial structure 301A can include vertical conductive structures 341-344, 353p-355p, and 353n-355n, and local interconnect structures 311p-315p and 311n-315n. In an example shown in FIG. 3A, each of the PA-PD is sandwiched between and thus is electrically coupled with the adjacent ones of the local interconnect structures 311p-315p. Each of the NA-ND is sandwiched between and thus is electrically coupled with the adjacent ones of the local interconnect structures 311n-315n. According to aspects of the disclosure, in subsequent steps, wirings among the transistors PA-PD and NA-ND and between the transistors PA-PD and NA-ND (e.g., via the local interconnect structures 311p-315p and 311n-315n) and power supplies, the input signals A-D, the output signal Y, and/or the like (e.g., via the vertical conductive structures 341-344, 353p-355p, and 353n-355n) can be formed by adding suitable connections at certain locations, as shown below in FIG. 3B.

FIG. 3B shows a schematic of the semiconductor apparatus 302 where the initial structure 301A is functionalized into a final structure 301B. The final structure 301B can be obtained by selectively adding connections 370-374 and 378-380, for example, at pre-defined locations. The connection 371 can electrically couple the local interconnect structure 312p with the vertical conductive structure 354p (also referred to as a first power-rail) that is to be connected to the first supply voltage VDD. The connections 378-379 can electrically couple the local interconnect structures 311n and 315n with the vertical conductive structure 354n (also referred to as a second power-rail) that is to be connected to the second supply voltage VSS. The connection 370 can electrically couple the local interconnect structure 314p with the vertical conductive structure 353p (or a vertical channel, vertical signal rail) configured to output the output signal Y. The connection 380 can electrically couple the local interconnect structure 313n with the vertical conductive structure 353n (or vertical signal rail) configured to output the output signal Y. In an example, the connections 370 and 380 are connected to output the output signal Y. The connections 372-374 (or vertical channels) can electrically couple the local interconnect structures 311p, 313p, and 315p with the vertical conductive structure 355p, i.e., connect the transistors PA-PD internally within the final structure 301B, for example, for inter-level wirings. After the functionalization (i.e., adding the connections 370-374 and 378-380) described above, the final structure 301B can implement the logic function of the AOI22 cell as shown in FIG. 1.

The vertical conductive structures 341-344 (or vertical interconnects, vertical gate connections) can be configured to wire 4 p-gates of PA-PD and 4 n-gates of NA-ND, respectively to the input signals A-D, for example, at a wiring level above the VFETs. In an example, the vertical conductive structures 341-344 can be connected to the respective gates via the gate connection structures 311-314. In an example, the gate connection structures 311-314 are formed and are coupled with the respective gates when forming the initial structure 301A. In an example, the gate connection structures 311-314 are formed when forming the initial structure 301A and are not coupled with the respective gates, and thus can be coupled with the respective gates when forming the final structure 301B. For purposes of clarity, connections between n-gates of NA-ND and the gate connection structures 311-314 are not shown. In an example shown in FIG. 3B, the vertical conductive structure 355n is not used in the final structure 301B.

In general, the 3D semiconductor apparatus 302 or the 3D layout primitive 300 can include additional cells or circuits, and the above description can be suitably adapted to functionalize the remaining initial structures 301A into the additional cells or circuits, such as the AOI22 cell, Inverters, NOR cells, and/or the like. In some examples, diffusion breaks are added to isolate the AOI22 cell from adjacent cells or structures. For purposes of brevity, the detailed descriptions are omitted.

In general, a semiconductor apparatus can include different types of cells, such as AOI22 cells, NOR cells, NAND cells, and/or the like. When designing and manufacturing the semiconductor apparatus, a layout primitive can be used in a first step where the layout primitive includes a highly repetitive initial structure that is not functionalized, such as the initial structure 207A in FIG. 2A and the initial structure 301A in FIG. 3A. Subsequently in a second step, the layout primitive can be functionalized by adding or removing connections at specific locations to obtain the semiconductor apparatus including a final structure such as the final structure 207B in FIG. 2B or the final structure 301B in FIG. 3B. Accordingly, the different types of cells in the semiconductor apparatus can be manufactured using the layout primitive having a same or similar repetitive initial structure. Therefore, different types of cells in a logic library can be designed and manufactured with a large amount of structural reuse.

The semiconductor apparatus 302 including the initial and final structures 301A-301B in FIGS. 3A-3B can be implemented using any suitable components and configurations. FIGS. 4A-4C and 5A-5F show an exemplary implementation of the semiconductor apparatus 302 and the 3D layout primitive 300 in 3D perspective views and 2D cross-sectional views, respectively. FIGS. 4A-4C and 5A-5F facilitate visualization of the disclosed method that manufactures the semiconductor apparatus 302.

Figure 4A:
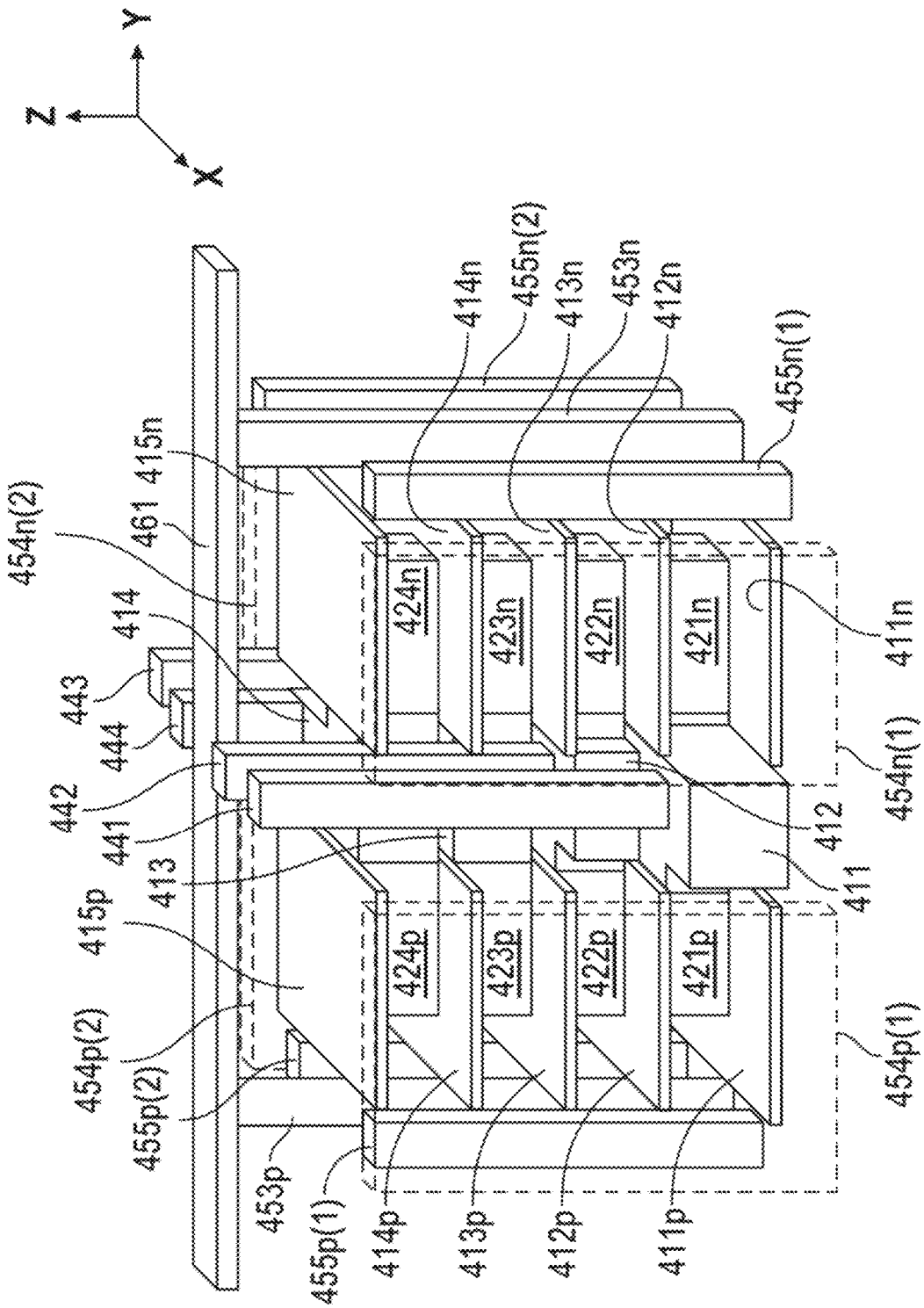

FIG. 4A shows an exemplary implementation 401A of the initial structure 301A according to an aspect of the disclosure. The implementation 401A is also referred to as the initial structure 401A. The initial structure 401A can be formed over a substrate of the semiconductor apparatus 302. The substrate can be any suitable semiconductor material, such as silicon (Si), silicon carbide (SiC), sapphire, germanium (Ge), gallium arsenide (GaAs), silicon germanium (SiGe), indium phosphide (InP), diamond, and the like. The substrate can be doped with an n-type and a p-type impurity. The substrate can include various layers, such as conductive or insulating layers formed on a semiconductor substrate, a silicon-on-insulator (SOI) structure, and the like. The substrate can also be strained.

Referring to FIG. 4A, the initial structure 401A includes the first stack of VFETs PA-PD, and the second stack of VFETs NA-ND. The p-type VFETs PA-PD include the p-type gates 421p-424p, respectively. The n-type VFETs NA-ND include the n-type gates 421n-424n, respectively. In an example, channel structures (not shown) can be located within the respective p-type gates 421p-424p and n-type gates 421n-424n. The channel structure can include any suitable structure and material systems to provide a semiconductor channel when one of the transistors PA-PD and NA-ND is in operation. The channel structure can have any suitable semiconductor material, including an elementary semiconductor such as Si, Ge, or the like, a compound semiconductor such as SiC, GaAs, gallium phosphide, InP, indium arsenide, or the like, an alloy semiconductor such as SiGe, or a combination thereof.

Figure 4B:
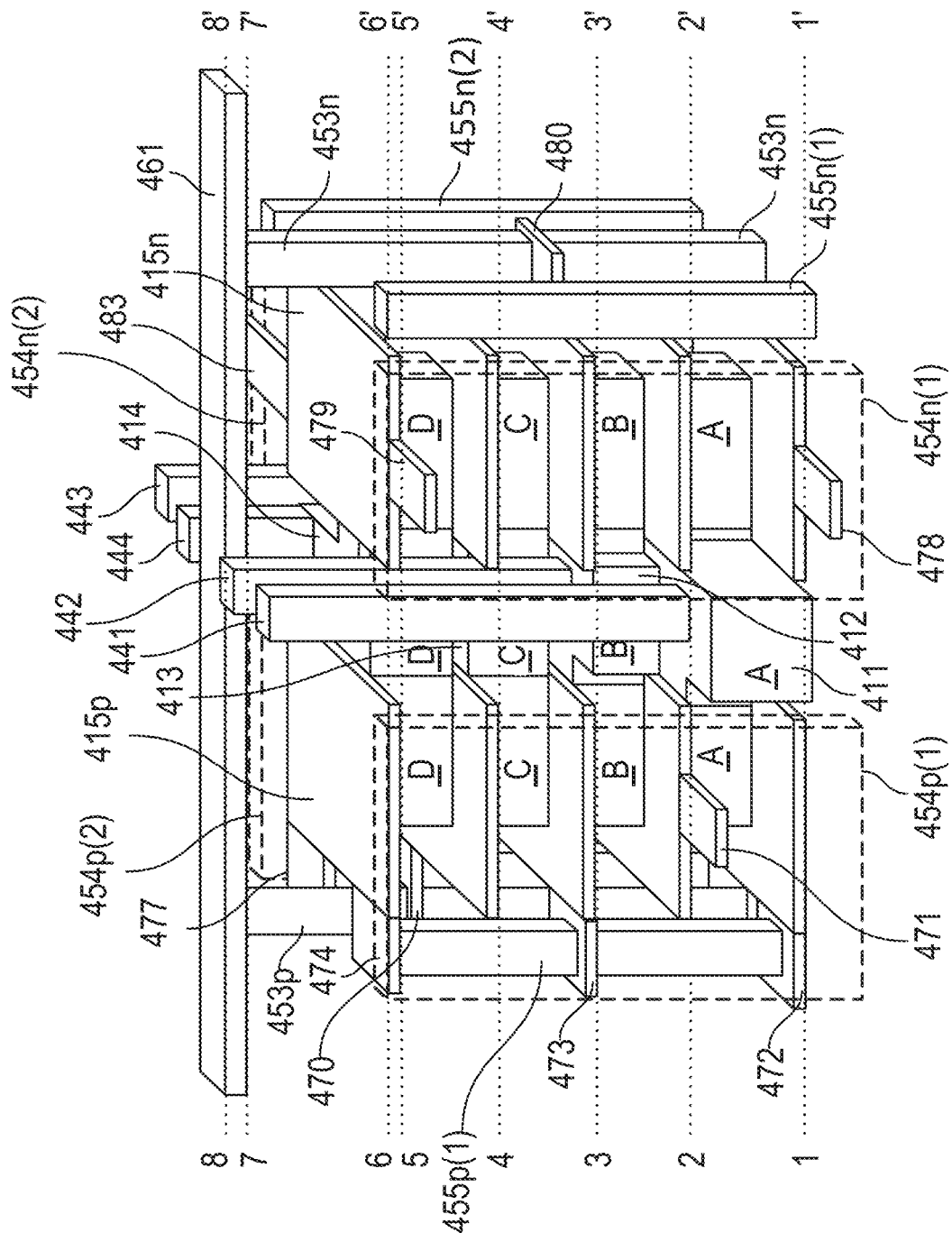

A component 4xx in FIGS. 4A-4B is the implementation of a component 3xx in FIGS. 3A-3B where xx is a number of 11-14, 41-44, 11p-15p, 11n-15n, and thus, the description of the components in FIGS. 4A-4B that are identical to those in FIGS. 3A-3B is omitted for purposes of clarity.

Gate connection structures (also referred to as gate connections) 411-414 are to strap the respective p-type and n-type gates 421p-424p and 421n-424n together. For example, the gate connection structure 411 can connect the p-type gate 421p and the n-type gate 421n, the gate connection structure 412 can connect the p-type gate 422p and the n-type gate 422n, the gate connection structure 413 can connect the p-type gate 423p and the n-type gate 423n, and the gate connection 414 structure can connect the p-type gate 424p and the n-type gate 424n. Referring to FIG. 4A, the gate connection structures 411-414 are connected to the respective p-type and n-type gates 421p-424p and 421n-424n.

Alternatively, in some examples (not shown), the gate connection structures are not connected to the respective p-type and n-type gates and in the initial structure and the functionalization can be implemented in subsequent steps Local interconnect structures 411p-415p and 411n-415n can provide connectivity into, out of, and in-between terminals (e.g., source region(s), drain region(s)) of the respective transistors PA-PD and NA-ND. The source region(s) and the drain region(s) can have any suitable semiconductor material or combination of semiconductor materials, such as Si, AlGaAs, Ge, GaAs, GaAsP, SiGe, InP, and the like.

In an example, the local interconnect structures 411p-415p and 411n-415n can have a shape of a thin plate where a dimension along the Z direction is smaller than dimensions along the X and Y directions, and thus are substantially parallel to the substrate plane of the 3D semiconductor apparatus 302. Accordingly, the local interconnect structures 411p-415p and 411n-415n can be referred to as source/drain access planes. Vertical interconnects (or vertical signal rails) 453p and 453n are configured to output the output signal Y. Vertical interconnects 455p(1)-(2) and 455n(1)-(2) are for inter-level wiring, and thus are to be connected to one or more of the local interconnect structures 411p-415p and 411n-415n in subsequent steps when the initial structure 401A is functionalized. Vertical interconnects (also referred to as power-rail connections) 454p(1)-(2) are to be connected to the first supply voltage VDD, and vertical interconnects (also referred to as power-rail connections) 454n(1)-(2) are to be connected to the second supply voltage VSS. The power-rail connections 454p(1)-(2) and 454n(1)-(2) can be formed using any suitable conductive material(s), such as ruthenium (Ru), copper (Cu), and the like.

The 3D layout primitive 300 and the 3D semiconductor apparatus 302 can include other initial structures that are similar or identical to the initial structure 401A. Thus, the initial structure 401A can repeat in the 3D layout primitive 300, for example, along one or more of the X, Y, and Z directions. In an example, the initial structure 401A repeats along the Z direction. In an example, the initial structure 401A repeats along the Y direction. In an example, the initial structure 401A repeats along the Y and Z directions. As described above, the initial structure 401A can be functionalized into an AOI22 cell. In general, the initial structure 401A can be functionalized into any suitable cell, such as a NOR cell, an NAND cell, or the like. Further, the initial structures 401A in the 3D layout primitive 300 can be functionalized into different types of cells, as described above, by adding or removing connections differently.

Figure 4C:
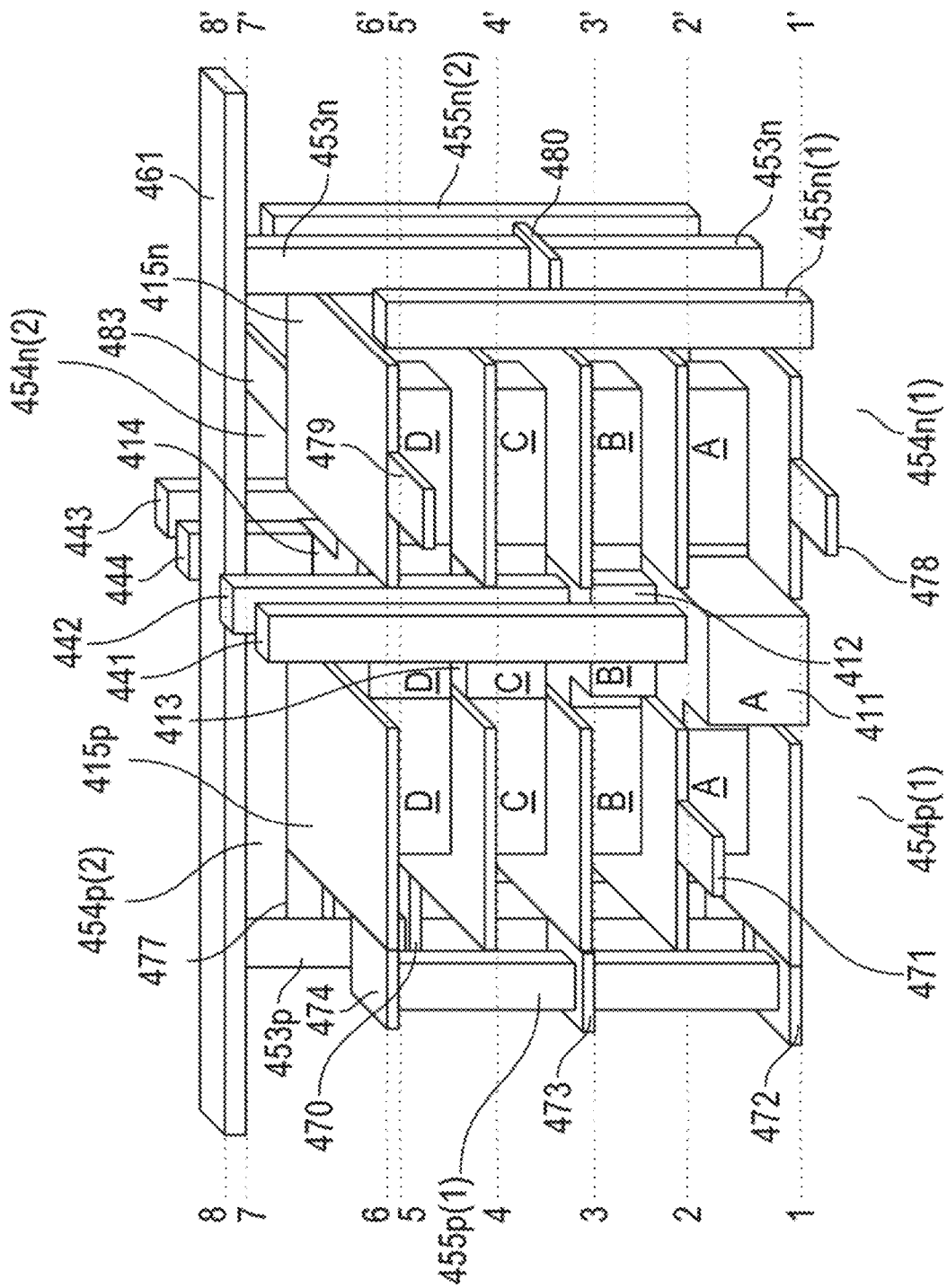

FIGS. 4B-4C shows an exemplary functionalization of the 3D layout primitive 300 according to an aspect of the disclosure. In FIG. 4B, the final structure 401B is an implementation of the final structure 301B. Thus, the final structure 401B is an AOI22 cell shown in FIG. 1. FIG. 4C is identical to FIG. 4B except that the power-rail connections 454p(1)-(2) and 454n(1)-(2) shown in FIG. 4B are removed from FIG. 4C for purposes of clarity. The initial structure 401A can be functionalized into the final structure 401B through addition of connections 470-483, and thus the functionalization is additive. The connections 470-483 are exemplary implementations of the connections 370-374 and 378-380 in FIG. 3B, and thus detailed descriptions are omitted for purposes of clarity. The connections 470-483 can have any suitable shapes, sizes, and material compositions. The shapes and sizes shown in FIGS. 4B-4C are for illustration purposes and do not limit the shapes and sizes of the connections 470-483. In an example, the connections 470-483 include conductive material(s).

Redundant connections can be used to increase reliability of a connection. For example, the connection 371 is implemented by the connections 471 and 481 connected to the power-rails 454p(1)-(2), respectively that are connected to the first supply voltage VDD. Similarly, the connection 378 is implemented by the connections 478 and 482 connected to the power-rails 454n(1)-(2), respectively that are connected to the second supply voltage VSS; the connection 379 is implemented by the connections 479 and 483 connected to the power-rails 454n(1)-(2), respectively that are connected to the second supply voltage VSS; the connection 372 is implemented by the connections 472 and 475 (not shown in FIG. 4B); the connection 373 is implemented by the connections 473 and 476 (not shown in FIG. 4B); and the connection 374 is implemented by the connections 474 and 477. In an example, the vertical conductive structures 441-444 (also referred to as vertical gate connections) are connected to the input signals A-D at a wiring level above the first and second stacks.

In general, the functionalization can be additive and/or subtractive. In an example, when a pre-formed connection is not needed, the pre-formed connection can be eliminated or removed during the functionalization, and the functionalization can be subtractive.

FIGS. 5A-5F show top-down views of the functionalized final structure 401B of respective levels in FIG. 4B according to aspects of the disclosure.

Figure 5B:
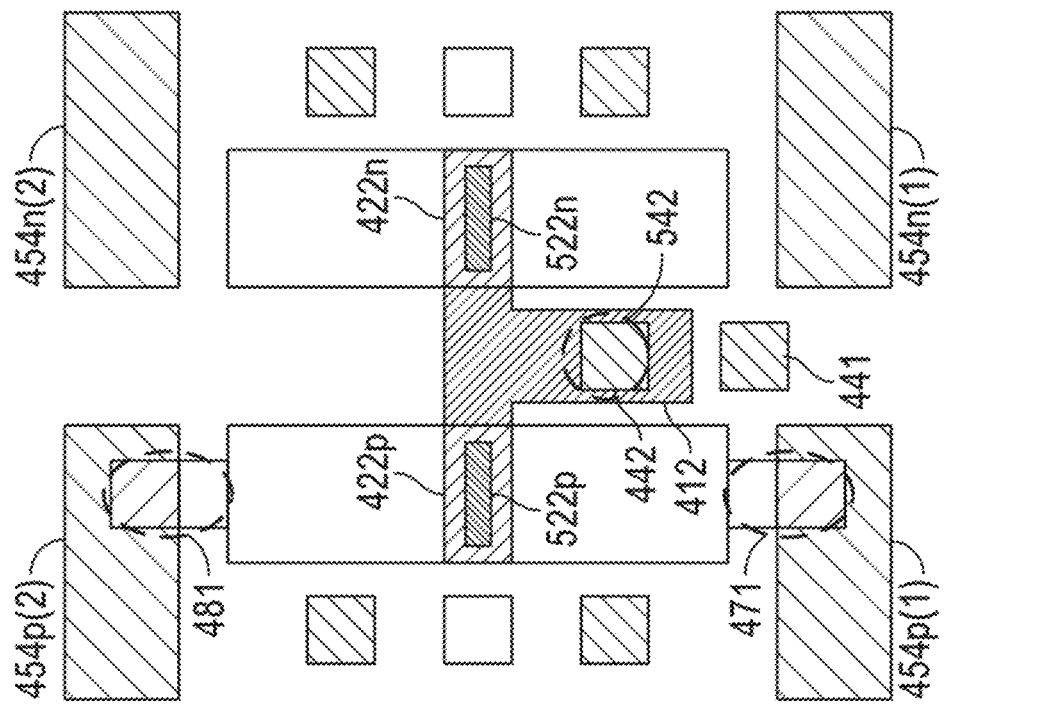
Figure 5A:
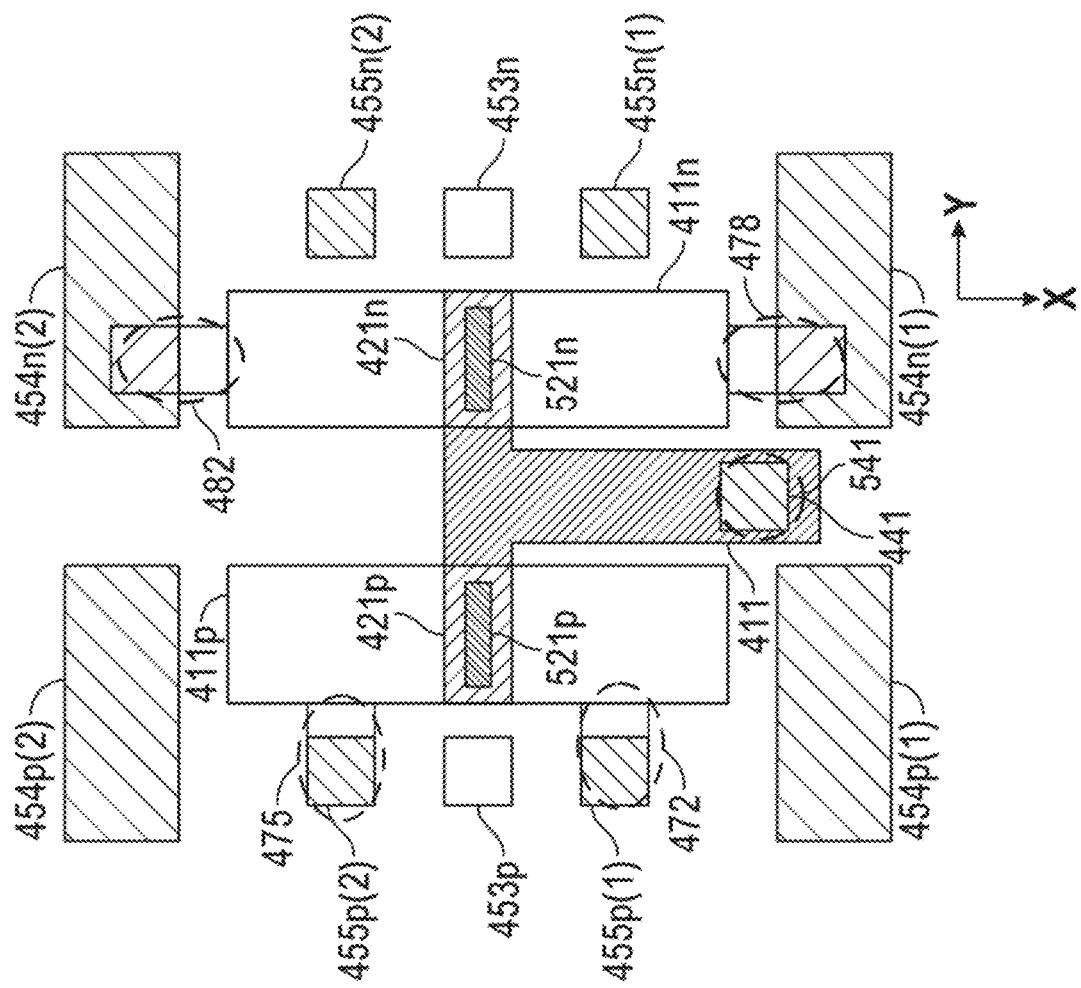

FIG. 5A shows the top-down view of a first level (also referred to as a first tier or a first level of a gate stack) in the final structure 401B between planes 11' and 22', and thus illustrates certain connections for PA and NA. The p-type gate 421p and the n-type gate 421n are connected to the gate connection structure 411. Referring to FIG. 5A, the p-type gate 421p, the n-type gate 421n, and the gate connection structure 411 form a 'T' shape structure. The p-type gate 421p, the n-type gate 421n, and the gate connection structure 411 can be polysilicon. The gate connection structure 411 is further connected to the vertical connection 441 at a location 541. As described above, the vertical connection 441 is to be connected to the input signal A, for example, from a wiring level above the first stack. The p-type gate 421p is connected to a p-channel structure 521p of PA. The n-type gate 421n is connected to an n-channel structure 521n of NA. In an example, the p-channel structure 521p and the n-channel structure 521n include different semiconductor materials.

In an example shown in FIG. 5A, the vertical interconnects 455p(1)-(2) are connected to the local interconnect structure 411p via the connections 472 and 475, respectively. The power-rail connections 454n(1)-(2) are connected to the local interconnect structure 411n via the connections 478 and 482 to provide the second supply voltage VSS to the final structure 401B with better reliability. Alternatively, only one of the vertical interconnects 455p(1)-(2) is connected to the local interconnect structure 411p via the connection 472 or 475, and only one of the power-rail connections 454n(1)-(2) is connected to the local interconnect structure 411n via the connection 478 or 482.

Referring to FIG. 5A and FIG. 2A, the final structure 207B in FIG. 2B occupies a first area that is 6 poly tracks along the Y direction and 6 metal tracks along the X direction while the final structure 401B in FIG. 5A occupies a second area that is 3 poly tracks along the Y direction and 5 metal tracks along the X direction. Therefore, the 3D layout primitive 300 can reduce the second area by at least 50%, i.e., can provide better than 50% area scaling over a planar rendering in the 2D layout primitive 200.

FIG. 5B shows the top-down view of a second level (also referred to as a second tier or a second level of the gate stack) in the final structure 401B between the plane 22' and a plane 33', and thus illustrates certain connections for PA-PB and NA-NB. The p-type gate 422p and the n-type gate 422n are connected to the gate connection structure 412. Referring to FIG. 5B, the p-type gate 422p, the n-type gate 422n, and the gate connection structure 412 form a 'T' shape structure. The p-type gate 422p, the n-type gate 422n, and the gate connection structure 412 can be polysilicon. The gate connection structure 412 is further connected to the vertical connection 442 at a location 542. As described above, the vertical connection 442 is to be connected to the input signal B, for example, from a wiring level above the first stack. The p-type gate 422p is connected to a p-channel structure 522p of PA. The n-type gate 422n is connected to an n-channel structure 522n of NA. In an example shown in FIG. 5B, the two power-rail connections 454p(1)-(2) are connected to the local interconnect structure 412p via the connections 471 and 481 to provide the first supply voltage VDD to the final structure 401B with better reliability. Alternatively, only one of the power-rail connections 454p (1)-(2) is connected to the local interconnect structure 412p via the connection 471 or 481.

Figure 5C:
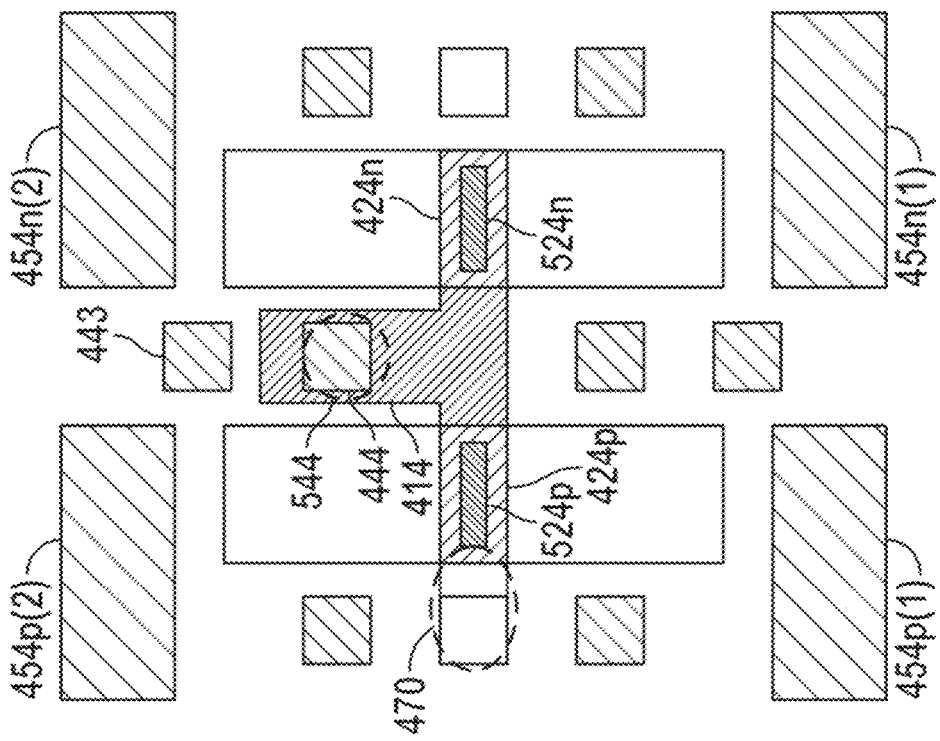

FIG. 5C shows the top-down view of a third level (also referred to as a third tier or a third level of the gate stack) in the final structure 401B between the plane 33' and a plane 44', and thus illustrates certain connections for PB-PC and NB-NC. The p-type gate 423p and the n-type gate 423n are connected to the gate connection structure 413. Referring to FIG. 5C, the p-type gate 423p, the n-type gate 423n, and the gate connection structure 413 form a 'T' shape structure. The p-type gate 423p, the n-type gate 423n, and the gate connection structure 413 can be polysilicon. The gate connection structure 413 is further connected to the vertical connection 443 at a location 543. As described above, the vertical connection 443 is to be connected to the input signal C, for example, from a wiring level above the first stack. The p-type gate 423p is connected to a p-channel structure 523p of PC. The n-type gate 423n is connected to an n-channel structure 523n of NC. In an example shown in FIG. 5C, the vertical interconnects 455p(1)-(2) are connected to the local interconnect structure 413p via the connections 473 and 476, respectively. Alternatively, only one of the vertical interconnects 455p(1)-(2) is connected to the local interconnect structure 413p via the connection 473 or 476.

Figure 5D:
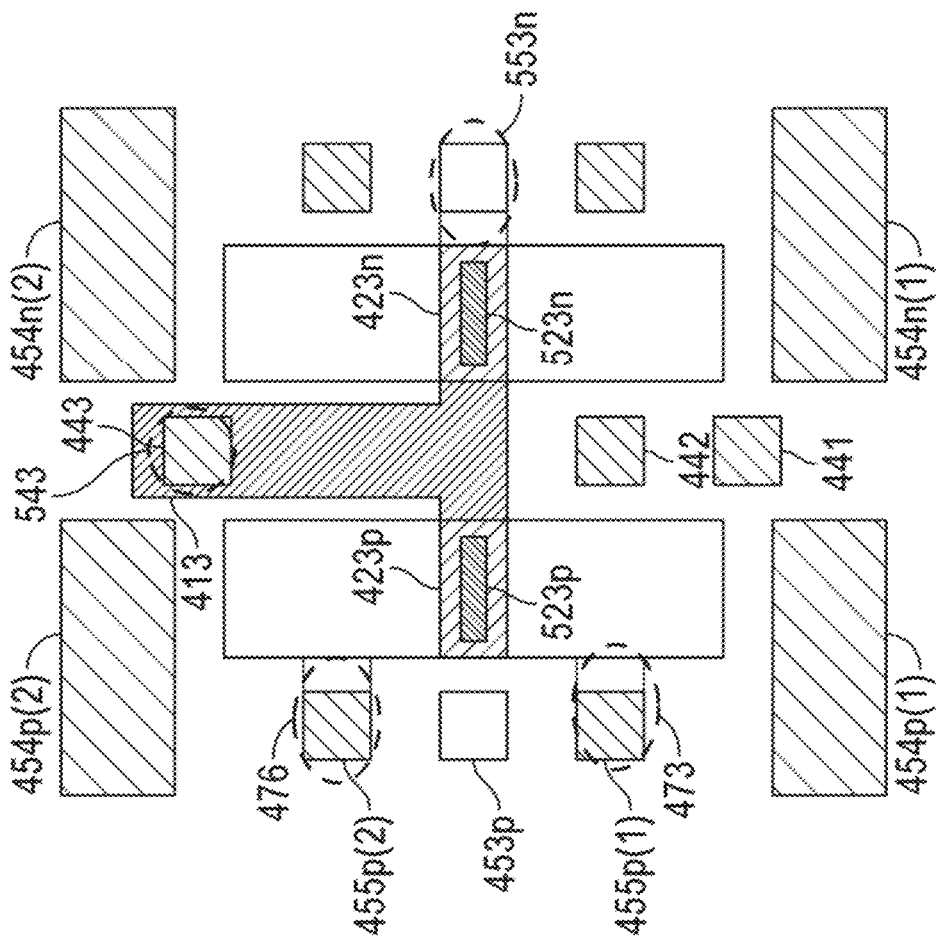

FIG. 5D shows the top-down view of a fourth level (also referred to as a fourth tier or a fourth level of a gate stack) in the final structure 401B between the plane 44' and a plane 55', and thus illustrates certain connections for PC-PD and NC-ND. The p-type gate 424p and the n-type gate 424n are connected to the gate connection structure 414. Referring to FIG. 5D, the p-type gate 424p, the n-type gate 424n, and the gate connection structure 414 form a 'T' shape structure. The p-type gate 424p, the n-type gate 424n, and the gate connection structure 414 can be polysilicon. The gate connection structure 414 is further connected to the vertical connection 444 at a location 544. As described above, the vertical connection 444 is to be connected to the input signal D, for example, from a wiring level above the first stack. The wiring levels for the input signals A-D can be identical. The p-type gate 424p is connected to a p-channel structure 524p of PD. The n-type gate 424n is connected to an n-channel structure 524n of ND. The vertical interconnect 453p is connected to the local interconnect structure 414p via the connection 470 to output the output signal Y.

FIG. 5E shows the top-down view of a fifth level (also referred to as a fifth tier or a fifth level of the gate stack) in the final structure 401B between the plane 55' and a plane 66', and thus illustrates certain connections for PD and ND.

The vertical interconnects 455p(1)-(2) are connected to the local interconnect structure 415p via the connections 474 and 477. The power-rail connections 454n(1)-(2) are connected to the local interconnect structure 415n via the connections 479 and 483. Alternatively, only one of the vertical interconnects 455p(1)-(2) is connected to the local interconnect structure 415p via the connection 474 or 477 and only one of the power-rail connections 454n(1)-(2) is connected to the local interconnect structure 415n via the connection 479 or 483.

FIG. 5F shows the top-down view of a sixth level (also referred to as a sixth tier or a sixth level of the gate stack) in the final structure 401B between planes 77' and 88', and thus illustrates connections for the output signal Y. The vertical interconnects 453p and 453n are connected to the output signal Y via an output rail 461 at locations 553p and 553n, respectively. The planes 11', 22', 33', 44', 55', 66', 77', and 88' are parallel to the substrate plane of the semiconductor apparatus 302.

The above description can be suitably adapted base on design considerations of a semiconductor apparatus. In an example shown in FIGS. 3A and 4A, each of the initial structures 301A and 401A includes two stacks of VFETs. In general, an initial structure in a 3D layout primitive can include any suitable number of stacks, such as 1, 2, 3, or the like. The stack can include any suitable semiconductor devices, such as p-type transistors, n-type transistors, or a combination of p-type and n-type transistors. In some examples, certain vertical conductive structures (e.g., 355n in FIG. 3B or the corresponding 455n(1)-455n(2) in FIG. 4B) and/or local interconnect structures (e.g., 312n and 314n in FIG. 3B) in an initial structure are not connected or used in a corresponding final structure and thus are not functionalized.

Referring to FIG. 4B, the vertical conductive structures are located in areas that are different from the first stack and the second stack. In an example shown in FIG. 4B, the vertical conductive structures surround the first stack and the second stack, such as on 4 different sides of the first stack and the second stack. However, any suitable configuration can be used to position the vertical conductive structures. Further, heights of the vertical conductive structures along the Z direction is at least a height of the first stack or the second stack. The local interconnect structures are thin plates where a dimension along the Z direction is smaller than dimensions within the substrate plate. However, any suitable shapes and sizes can be used to form the local interconnect structures.

While shown as separate structures in FIGS. 5A-5F, one or more of the connections used to functionalize the 3D layout primitive 300 can be merged with one or more of the local interconnect structures to reduce a number of masks used in a manufacturing process. Alternatively, electrical means of forming or removing certain connections can be used to facilitate the functionalization of the final structure 401B.

While shown herein for 3D logic circuits using VFETs, the description can be suitably adapted to 3D memory semiconductor apparatus such as a stacked SRAM as well as for other transistor types such as vertically stacked CFETs.

Figure 6:
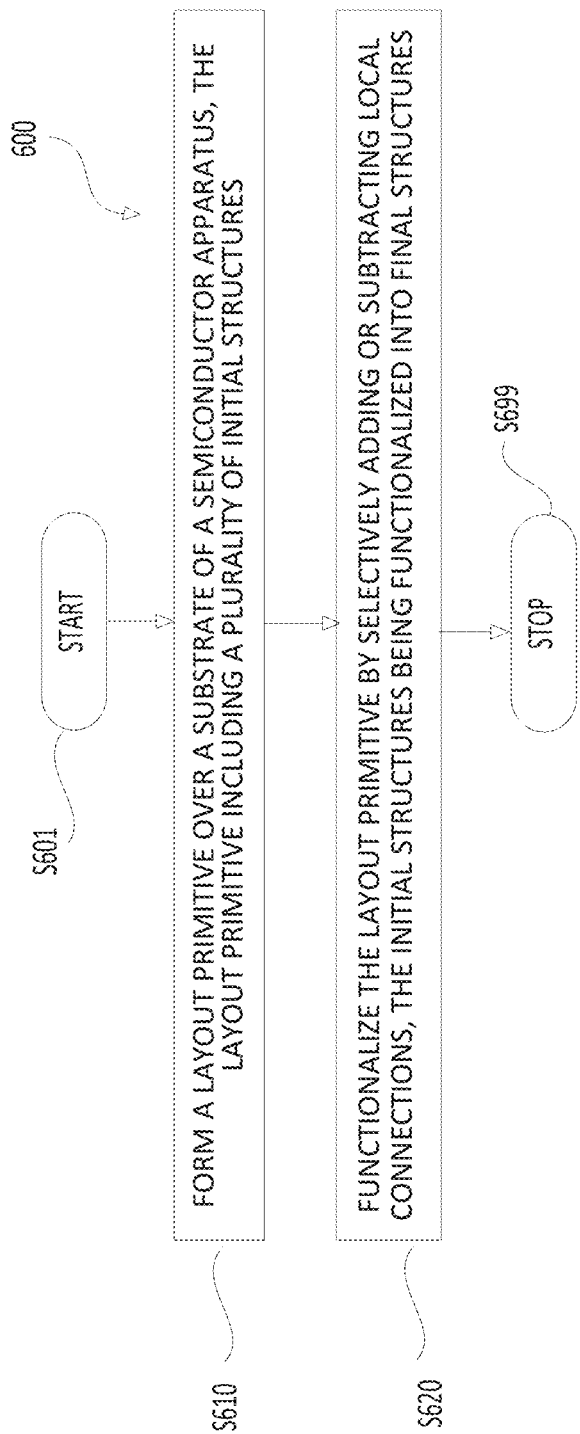
FIG. 6 shows a flow chart outlining an exemplary process 600 for semiconductor fabrication according to an embodiment of the disclosure.

FIG. 6 shows a flow chart outlining an exemplary process 600 for semiconductor fabrication according to an embodiment of the disclosure. The process 600 can be used to fabricate the 3D semiconductor apparatus 302 (or the 3D layout primitive 300), the 2D layout primitive 200, and the like. As used herein, a semiconductor apparatus can include transistors (e.g., field-effect transistors and floating-gate transistors), integrated circuits, a semiconductor chip (e.g., memory chip including a 3D NAND memory device, a logic chip on a semiconductor die), a stack of semiconductor chips, a semiconductor package, a semiconductor wafer, and the like. The process 600 starts at step S601 and proceeds to step S610.

At S610, a layout primitive can be formed over a substrate of a semiconductor apparatus where the layout primitive can include a plurality of initial structures. As described above with reference to FIGS. 2A-2B, 3A-3B, 4A-4B, and 5A-5F, the initial structures, such as the initial structures 207A and 301A, are highly repetitive and can be identical or similar to each other. Each one of the initial structures can include one or more stacks of transistors, such as VFETs. Referring to FIGS. 3A and 4A, the initial structures can include certain local interconnect structures, such as the local interconnect structures 311p-315p, 311n-315n, 411p-415p, and 411n-415n, that are not connected to power-rails, output signal(s), or the like. The initial structures can include vertical conductive structures, such as the vertical conductive structures 341-344, 353p-355p, and 353n-355n in FIG. 3A and 441-444, 453p-455p, and 453n-455n in FIG. 4A. The initial structures are not functionalized.

At S620, the layout primitive can be functionalized by selectively adding or subtracting local connections, and thus the initial structures are functionalized into final structures, such as the final structures 207B and 301B as described above, and thus the detailed descriptions can be omitted for purpose of brevity. For example, the local interconnect structures can be connected to the power-rails, the output signal(s), or the like. In addition, certain internal connections can be made within each of the final structures. The final structures can include one or more types of standard cells, such as an AOI cell, a NOR cell, or the like. The process 600 then proceeds to S699 and terminates.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A method for forming a semiconductor apparatus, comprising:

forming a plurality of repetitive initial structures over a substrate of the semiconductor apparatus wherein an initial structure in the plurality of repetitive initial structures is formed by:
  forming a first stack of transistors along a Z direction substantially perpendicular to a substrate plane, including:
    forming a first transistor on the substrate, the first transistor formed with a first gate and a first channel surrounded by the first gate;
    forming a second transistor over the first transistor along the Z direction, the second transistor formed with a second gate and a second channel surrounded by the second gate;
    forming local interconnect structures, each of the transistors in the first stack of transistors being sandwiched between two of the local interconnect structures;
    forming vertical conductive structures substantially parallel to the Z direction, a height of one of the vertical conductive structures along the Z direction being at least a height of the initial structure; and
    forming the first stack of transistors as a stack of vertical field-effect transistors (VFETs), a current between a source and a drain of each of the VFETs transistors flowing substantially along the Z direction; and
  forming a second stack of transistors adjacent to the first stack of transistors along the Z direction, including:
    forming a third transistor on the substrate, the third transistor formed with a third gate and a third channel surrounded by the third gate;
    forming a fourth transistor over the third transistor along the Z direction, the fourth transistor formed with a fourth gate and a fourth channel surrounded by the fourth gate;
  functionalizing the initial structure into a final structure by forming one or more connections each electrically coupling one of the local interconnect structures to one of the vertical conductive structures;
  forming a first gate connection structure electrically coupling a first gate of the first transistor with a third gate of the third transistor; and
  forming a second gate connection structure electrically coupling a second gate of the second transistor with a fourth gate of the fourth transistor.

2. The method of claim 1, wherein the forming the vertical conductive structures comprises forming vertical conductive structures over the substrate in a different area than the first stack of transistors.

3. The method of claim 1, wherein forming the vertical conductive structures comprises forming power-rails for a first supply voltage and a second supply voltage, heights of the power-rails being equal to or larger than the of the initial structure.

4. The method of claim 1, wherein the forming a plurality of repetitive initial structures comprises forming first and second initial structures having identical components.

5. The method of claim 1, wherein the forming local interconnect structures comprises forming horizontal local interconnect structures which extend substantially parallel to the substrate plane.

6. The method of claim 1, wherein the forming the vertical conductive structures comprises forming a vertical connection for outputting an output signal, the height of the vertical connection being larger than the height of the initial structures.

7. The method of claim 1, wherein the forming local interconnect structures comprises:
  forming a lower local interconnect structure below a lowermost transistor in the first stack, and
  forming an upper local interconnect structure above an uppermost transistor in the first stack.

8. The method of claim 7, wherein the forming vertical conductive structures comprises forming a vertical connection that electrically couples the lowermost transistor and the uppermost transistor via the lower and upper local interconnect structures, the height of the vertical connection being equal to or larger than the height of the initial structures.

9. The method of claim 1, wherein the first gate and the second gate are p-type gates, and the third gate and the fourth gate are n-type gates.

10. The method of claim 1, wherein the forming vertical conductive structures comprises forming vertical connections electrically coupling the first and second gate connection structures to respective input signals at a wiring level that is above the initial structures.

11. The method of claim 4, further comprising:
  functionalizing the first initial structure as a first logic cell, and
  functionalizing the second initial structure as a second logic cell that implements a same random logic function as the first logic cell.

12. The method of claim 4, further comprising:
  functionalizing the first initial structure as a first logic cell, and
  functionalizing the second initial structure as a second logic cell that implements a different random logic function from the first logic cell.

13. The method of claim 1, wherein the forming vertical conductive structures comprises forming vertical conductive structures which surround the first stack of transistors and the second stack of transistors.

14. The method of claim 3, wherein the forming power-rails comprises forming power-rails electrically coupled to the first stack of transistors via one or more of the local interconnect structures.

15. The method of claim 6, wherein forming the vertical connection comprises electrically coupling the vertical connection to the first stack of transistors via one or more of the local interconnect structures.

16. A method for forming a semiconductor apparatus, comprising:
  forming a plurality of repetitive initial structures over a substrate of the semiconductor apparatus wherein an initial structure in the plurality of repetitive initial structures is formed by:
    forming a first stack of transistors including:
      forming a first transistor on the substrate, the first transistor formed with a first gate and a first channel surrounded by the first gate;
      forming a second transistor over the first transistor along a Z direction substantially perpendicular to a substrate plane, the second transistor formed with a second gate and a second channel surrounded by the second gate;
      forming local interconnect structures, including forming at least a first local interconnect structure and forming a second local interconnect structure, positioning both the first gate and the first channel above the first local interconnect structure and below the second local interconnect structure along the Z direction, positioning both the second gate and the second channel above the second local interconnect structure along the Z direction, connecting the local interconnect structures to at least one of (i) a source region or a drain region of the first transistor and (ii) a source region or a drain region of the second transistor, forming one of the local interconnect structures adjacent to (i) the source region or the drain region of the first transistor and (ii) the source region or the drain region of the second transistor, wherein the source region or the drain region of the second transistor is stacked above the source region or the drain region of the first transistor along the Z direction that is substantially perpendicular to the substrate plane, the first and second transistors being vertical field-effect transistors in that a current between source and drain of each transistor flows along the Z direction; and forming vertical conductive structures substantially parallel to the Z direction, the vertical conductive structures formed to provide at least power supplies for the first one of the structures by electrically coupling with the local interconnect structures, a height of one of the vertical conductive structures along the Z direction being at least a height of the first one of the structures; and functionalizing the initial structure into a final structure by forming one or more connections each electrically coupling one of the local interconnect structures to one of the vertical conductive structures.

17. A method for forming a semiconductor apparatus, comprising:

forming a plurality of structures, wherein forming a first one of the structures of the plurality of structures includes forming a first stack of transistors by:

forming a first transistor on a substrate; and forming a second transistor stacked on the first transistor along a Z direction substantially perpendicular to a substrate plane, the first and second transistors being vertical field-effect transistors having a channel positioned to have current flow in the Z direction between corresponding source and drain;

forming local interconnect structures such that the first transistor is sandwiched along the Z direction between two of the local interconnect structures that are connected to a source region and a drain region of the first transistor, respectively, the local interconnect structures further formed such that they are connected to at least one of (i) the source region or the drain region of the first transistor and (ii) a source region or a drain region of the second transistor, positioning one of the local interconnect structures adjacent to (i) the source region or the drain region of the first transistor and (ii) the source region or the drain region of the second transistor such that the source region or the drain region of the second transistor is stacked above the source region or the drain region of the first transistor along the Z direction that is substantially perpendicular to the substrate plane; and forming vertical conductive structures substantially parallel to the Z direction, the vertical conductive structures positioned to provide at least power supplies for the first one of the structures by electrically coupling with the local interconnect structures, forming a height of one of the vertical conductive structures along the Z direction at least a height of the first one of the structures, connecting one of the vertical conductive structures to a plurality of the local interconnect structures, forming a second one of the structures with identical components as the first one of the structures, forming the vertical conductive structures over the substrate in a different area than the first stack of transistors, wherein forming the first one of the structures further comprises:

forming a second stack of transistors adjacent to the first stack of transistors and including:

forming a third transistor on the substrate; and forming a fourth transistor stacked on the third transistor along the Z direction, the second stack of transistors positioned in a different area than the first stack of transistors and the vertical conductive structures;

forming a first gate connection structure that electrically couples a first gate of the first transistor with a third gate of the third transistor; and forming a second gate connection structure that electrically couples a second gate of the second transistor with a fourth gate of the fourth transistor.

18. The method of claim 17, wherein the vertical conductive structures include vertical connections formed by electrically coupling the first gate connection structure and the second gate connection structure to respective input signals at a wiring level that is above the first one of the structures.

* * * * *